(12) United States Patent
Lin

(10) Patent No.: US 7,223,683 B2
(45) Date of Patent: May 29, 2007

(54) WAFER LEVEL BUMPING PROCESS

(75) Inventor: Chian-Chi Lin, Tainan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 79 days.

(21) Appl. No.: 10/876,582

(22) Filed: Jun. 28, 2004

(65) Prior Publication Data
US 2005/0009317 A1 Jan. 13, 2005

(30) Foreign Application Priority Data
Jun. 30, 2003 (TW) .............................. 92117893 A

(51) Int. Cl.
H01L 21/44 (2006.01)

(52) U.S. Cl. ...................................... 438/613; 257/737

(58) Field of Classification Search ........ 257/734–738; 361/600; 438/612–613
See application file for complete search history.

(56) References Cited

U.S. PATENT DOCUMENTS

| 6,350,668 | B1 * | 2/2002 | Chakravorty | 438/612 |
|---|---|---|---|---|
| 6,400,021 | B1 * | 6/2002 | Cho | 257/738 |
| 6,455,408 | B1 * | 9/2002 | Hwang et al. | 438/613 |
| 6,541,303 | B2 * | 4/2003 | Akram et al. | 438/106 |
| 6,642,136 | B1 * | 11/2003 | Lee et al. | 438/613 |
| 6,689,680 | B2 * | 2/2004 | Greer | 438/614 |
| 6,869,870 | B2 * | 3/2005 | Lin | 438/622 |
| 2001/0020737 | A1 * | 9/2001 | Kwon et al. | 257/678 |
| 2002/0096764 | A1 * | 7/2002 | Huang | 257/737 |
| 2002/0185721 | A1 * | 12/2002 | Hwang et al. | 257/678 |
| 2003/0162323 | A1 * | 8/2003 | Akram et al. | 438/106 |
| 2004/0094837 | A1 * | 5/2004 | Greer | 257/737 |
| 2004/0212102 | A1 * | 10/2004 | Akram et al. | 257/781 |
| 2004/0266163 | A1 * | 12/2004 | Horng | 438/614 |
| 2005/0048695 | A1 * | 3/2005 | Chia et al. | 438/106 |
| 2005/0189650 | A1 * | 9/2005 | Lee et al. | 257/738 |
| 2005/0230783 | A1 * | 10/2005 | Lin | 257/531 |
| 2005/0236709 | A1 * | 10/2005 | Eng et al. | 257/737 |

* cited by examiner

Primary Examiner—Nathan W. Ha
(74) Attorney, Agent, or Firm—Bacon & Thomas, PLLC

(57) ABSTRACT

A bumping process mainly comprises the following steps. Initially, a wafer having a plurality of bonding pads and a passivation layer with passivation openings exposing the bonding pads is provided. Next, a first dielectric layer with first openings and second openings is disposed on the wafer. The first openings and second openings expose the bonding pads and the portions of the passivation layer respectively. Afterwards, a patterned first electrically conductive layer is formed over the first dielectric layer and the bonding pads. Then a second dielectric layer is formed over the first dielectric layer and the patterned first electrically conductive layer and exposes the patterned first conductive layer through the second openings to form a plurality of bump pads wherein the bump pads are electrically connected to bonding pads. Next, a second electrically conductive layer is formed over the second dielectric layer and the bump pads. Then, a plurality of bumps are formed on the portions of the second electrically conductive layer covering the bump pads. Finally, the bumps are reflowed and the portions of the second electrically conductive layer covered by the reflowed bumps are remained to form a patterned second electrically conductive layer.

20 Claims, 5 Drawing Sheets

WAFER LEVEL BUMPING PROCESS

BACKGROUND OF THE INVENTION

1. Field of Invention

This invention relates to a bumping process. More particularly, the present invention is related to a bumping process for ensuring the reliability of bumps and the integrity of the dielectric layer covering the redistributed layer of the bumped wafer.

2. Related Art

In this information explosion age, integrated circuits products are used almost everywhere in our daily life. As fabricating technique continue to improve, electronic products having powerful functions, personalized performance and a higher degree of complexity are produced. Nowadays, most electronic products are relatively light and have a compact body. Hence, in semiconductor production, various types of high-density semiconductor packages have been developed. Flip chip is one of the most commonly used techniques for forming an integrated circuits package. Moreover, compared with a wire-bonding package or a tape automated bonding (TAB) package, a flip-chip package uses a shorter electrical path on average and has a better overall electrical performance. In a flip-chip package, the bonding pads on a chip and the contacts on a substrate are connected together through a plurality of bumps formed by the method of bumping process. Accordingly, the technology of bumping process becomes more and more important in the advanced packaging fields.

As mentioned above, in a conventional bumping process, a stencil or a photosensitive film, such as a photo-resist layer, having a plurality of openings that exposes the bonding pads is formed over the active surface of the chip (or wafer) to serve as a mask. Thereafter, a plating process or a printing process is carried out to fill solder material into the openings over the bonding pads. The stencil or the photosensitive film is then removed to have the solder layer exposed over various bonding pads. After a reflow process, the solder layers solidify into a plurality of bumps and each bump has a spherical profile on the corresponding bonding pad.

Referring to FIG. 1A to FIG. 1G, which illustrate magnified cross-sectional views of the bump of a wafer showing the steps for producing a bump according to a conventional method. First, as shown in FIG. 1A, a wafer 100 having an active surface 101 with a plurality of bonding pads 102 (only one is shown) and a passivation layer 104 thereon is provided. The passivation layer 104 are positioned over the active surface 101 and exposes the bonding pads 102 through passivation openings 104a (only one is shown) formed in the passivation layer 104.

Next, as shown in FIG. 1B, a first dielectric layer 105 is formed over the passivation layer 104 and covers a portion of each bonding pad 102 to leave one of bonding pads 102 exposed out of the first dielectric layer 105 through a first opening 105a and have a portion of passivation layer 104 exposed out of the first dielectric layer 105 through a second opening 105b.

Next, a redistributed layer 106 is formed over the first dielectric layer 105, the bonding pad 102 and the passivation layer 104 exposed out of the first dielectric layer 105, wherein the portion of the redistributed layer 106 directly connecting the passivation layer 104 serves as a bump pad 106a. Generally, the redistributed layer 106 is formed by the following steps. Firstly, a first electrically conductive layer is formed over the first dielectric layer. Next, a photo-resist layer is formed on and partially covers the first electrically conductive layer. Then, a photolithographic process and an etching process are performed to remove the portion of the first electrically conductive layer not covered by the photo-resist layer to form a patterned first electrically conductive layer serving as the redistributed layer as mentioned above. Therein, the bump pad is electrically connected to the bonding pad through said patterned first electrically conductive layer.

Then, referring to FIG. 1D, a patterned second electrically conductive layer 107 is formed over the redistributed pad 106a by the steps of disposing photo-resist layer, performing a photolithographic process, and performing an etching process and serves as a transition layer or an under bump metallurgy layer located over the bump pad 106a.

Afterwards, referring to FIG. 1E, a second dielectric layer 108 is formed over the patterned first electrically conductive layer 106 with a third opening 108a exposing the portion of the patterned second electrically conductive layer 107, which is located over the bump pad 106a.

Next, referring to FIG. 1F, a photo-resist layer 109 is formed over the second dielectric layer 108 with a fourth opening 109a exposing the portion of the patterned second electrically conductive layer 107 located over the bump pad 106a. Then, a solder material is filled in the fourth opening 109a through a screen-printing method to form a bump 110.

Finally, the bump 110 is reflowed to be fixed on the patterned second electrically conductive layer 107 over the bump pad 106a securely and shaped into a solder ball 112; and the second dielectric layer 108 is removed in sequence.

However, in the aforementioned conventional bumping process, the solder material is a mixture of solder powder and flux, and the second dielectric layer 108 is usually made of a polymer material, such as polyimide (PI) and Benzocyclobutene (BCB). The flux within the solder material will react with the polymer material to produce water and carbon dioxide or some other gases, so the gases including water and carbon dioxide inside the bump 126 will form air bubbles and said bubbles will stay in the reflowed bump, after the reflow process is performed as shown in FIG. 1G. Hence, the mechanical strength of the bump will be lowered to reduce the reliability of the bump.

Furthermore, the photo-resist layer 109 is typically removed by etching with an etchant. The etchant not only etches away the photo-resist layer 109, but also attach the second dielectric layer 108 made of polymer material underneath the photo-resist layer 109 so that a portion of the second dielectric layer 108 will be removed or damaged. Any loss of integrity of the polymer layer 108 is likely to compromise the protective capacity on the wafer 100.

Therefore, providing another method for forming bumps to solve the mentioned-above disadvantages is the most important task in this invention.

SUMMARY OF THE INVENTION

In view of the above-mentioned problems, an objective of this invention is to provide a method of forming bumps capable of reducing bubbles inside the bumps to enhance the reliability of bumps.

To achieve these and other advantages and in accordance with the purpose of the invention, as embodied and broadly described herein, the invention provides a bumping process including the following steps. Firstly, a first dielectric layer is formed over the active surface of the wafer wherein the first dielectric layer comprising a plurality of first openings and second openings to expose the bonding pads and portions of the passivation layer formed on the active surface of the wafer respectively. Next, a patterned first electrically conductive layer is formed over the first dielectric layer, the exposed portions of the passivation layer through the second openings and the bonding pads exposed out of the first openings. Then, a second dielectric layer is formed over the first dielectric layer and the patterned first electrically conductive layer with third openings, which expose portions of the patterned first electrically conductive layer disposed in the second openings to be regarded as the bump pads. Therein, the bump pads are electrically connected to the bonding pads through the patterned first electrically conductive layer. Afterwards, a second electrically conductive layer is formed over the second dielectric layer and the bump pads. Next, a plurality of bumps are formed on the second electrically conductive layer and located over the bump pads, and a reflow process is then performed to have said bumps transformed into reflowed bumps which are securely attached to the second electrically conductive layer. Finally, the second electrically conductive layer is patterned through taking the reflowed bumps as masks to etch away the portions of the second electrically conductive layer not covered by the reflowed bumps and form a patterned second electrically conductive layer.

As mentioned above, when the reflow process is performed, the second dielectric layer is covered by the second electrically conductive layer. Hence, the bumps are separated from the second dielectric layer so as to avoid the flux reacting with the second dielectric layer. Accordingly, the reliability of the reflowed bumps will be kept great.

Furthermore, the photo-resist layer for defining the locations and size of the bumps is disposed over the second electrically conductive layer. Accordingly, the second dielectric layer located below the second electrically conductive layer will not reacted with the etchant when removing said photo-resist layer. In such a manner, the integrity of the second dielectric layer and the capability of protecting wafer will be kept great.

In addition, the photo-resist layer for defining the locations and size of the bumps is removed before the bumps are reflowed. Accordingly, the bumps will not have bubbles therein due to the reaction of the photo-resist layer with the solder material.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1A:
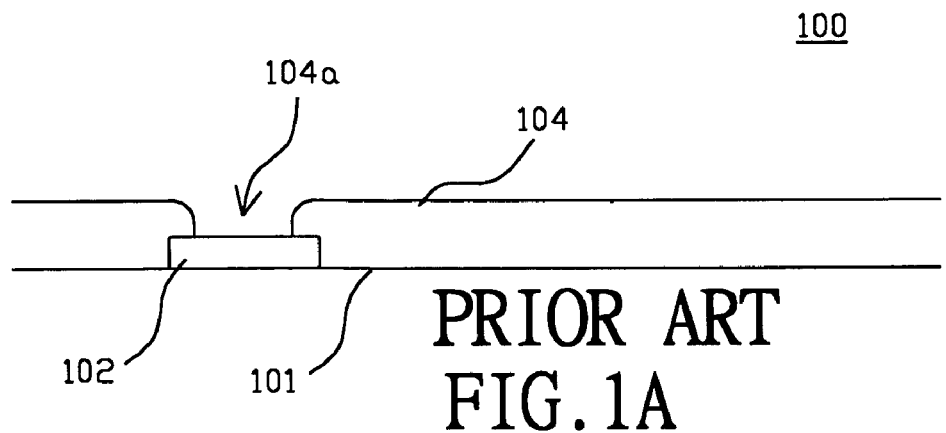
FIGS. 1A to 1G are partially enlarged cross-sectional views showing the conventional progression of steps for forming a bump.
Figure 1B:
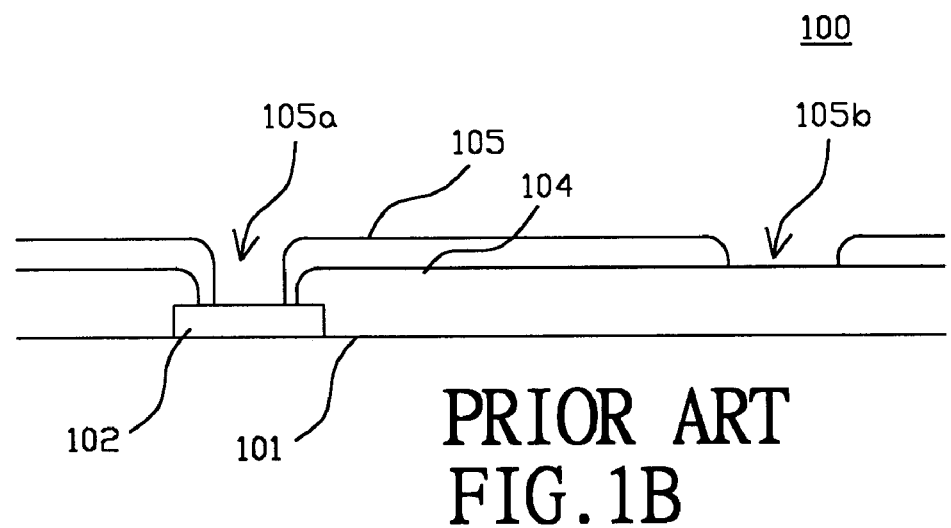
Figure 1C:
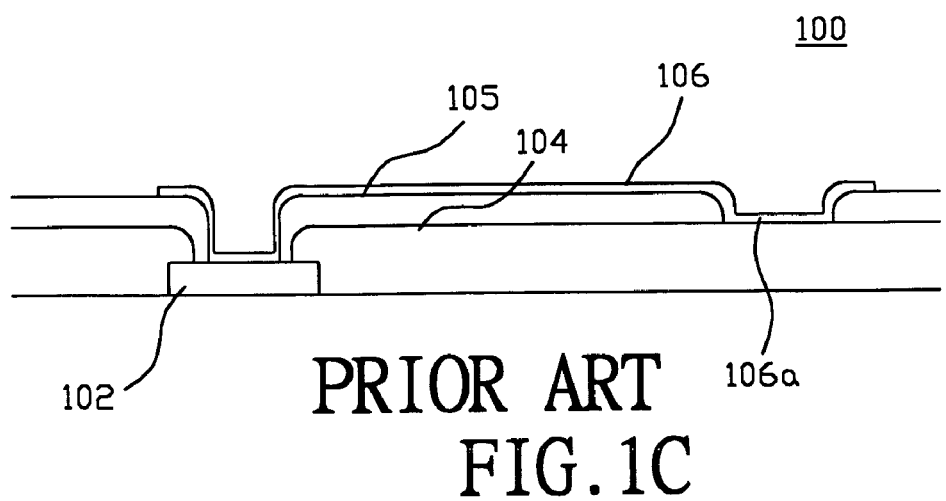
Figure 1D:
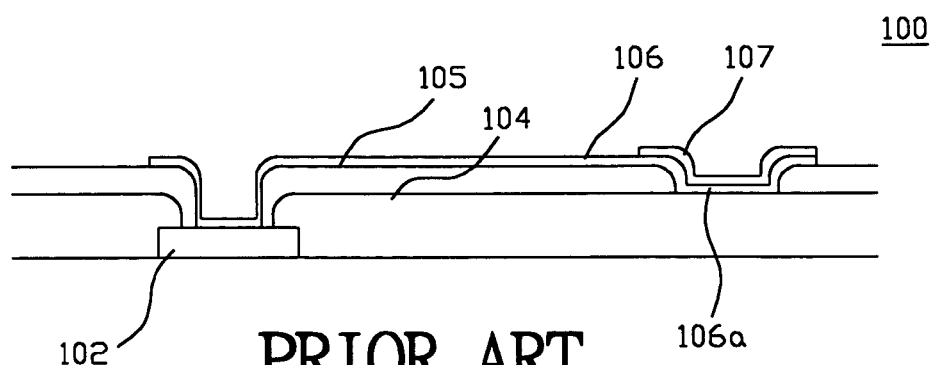
Figure 1E:
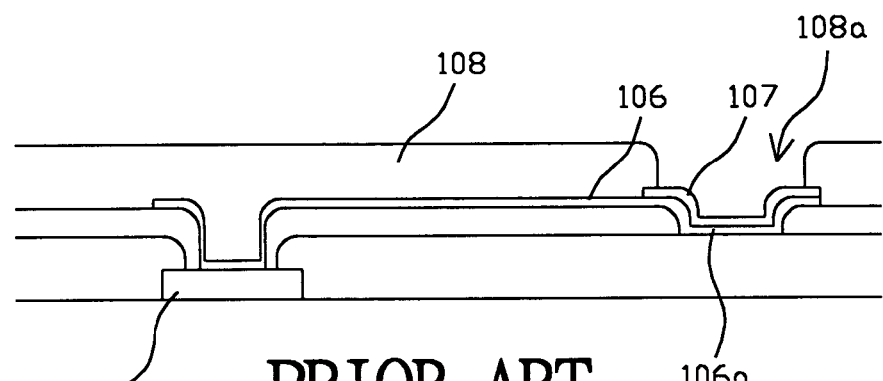
Figure 1F:
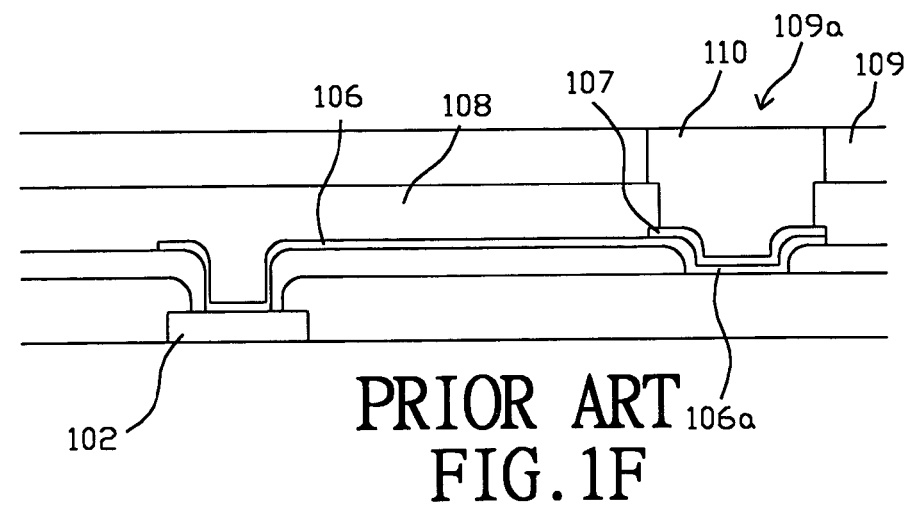
Figure 1G:
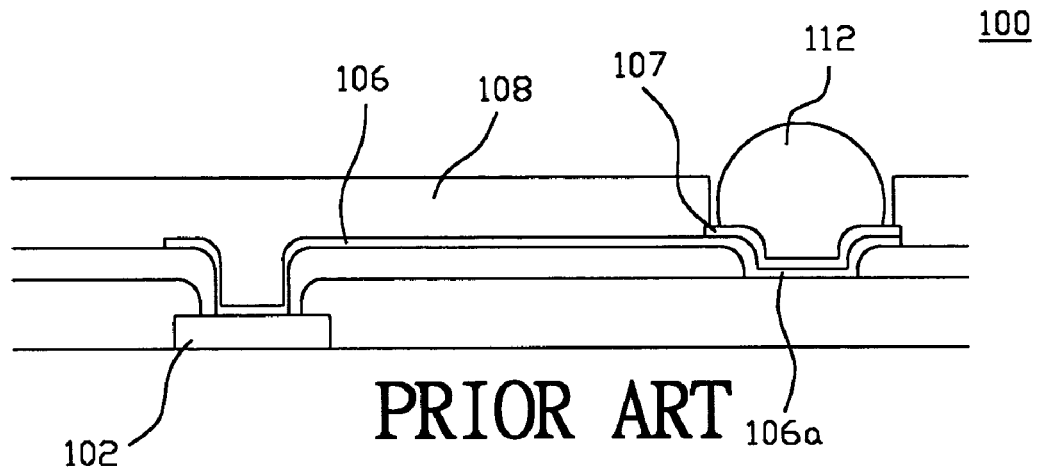

The method of forming bumps according to the preferred embodiment of this invention will be described herein below with reference to the accompanying drawings, wherein the same reference numbers are used in the drawings and the description to refer to the same or like parts.

FIGS. 2A to 2H are partially enlarged cross-sectional views showing the progression of steps for forming a bump according to the preferred embodiment of this invention.

Figure 2A:
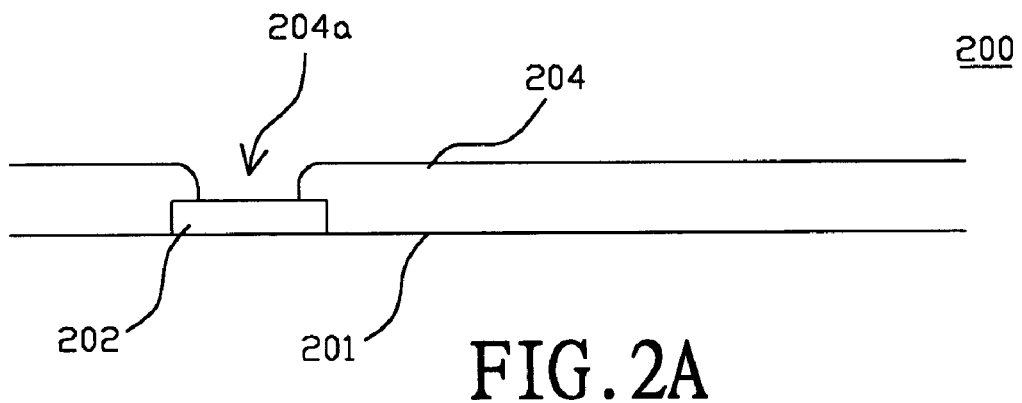
FIGS. 2A to 2H are partially enlarged cross-sectional views showing the progression of steps for forming a bump according to the preferred embodiment of this invention.

As shown in FIG. 2A, a silicon wafer 200 having an active surface 201, a plurality of bonding pads 202 and a passivation layer 204. Therein, the passivation layer 204 with passivation openings 204a (only one is shown) covers the active surface 201 of the silicon wafer 200 and exposes the bonding pads 202 through the passivation openings 204a.

Figure 2B:
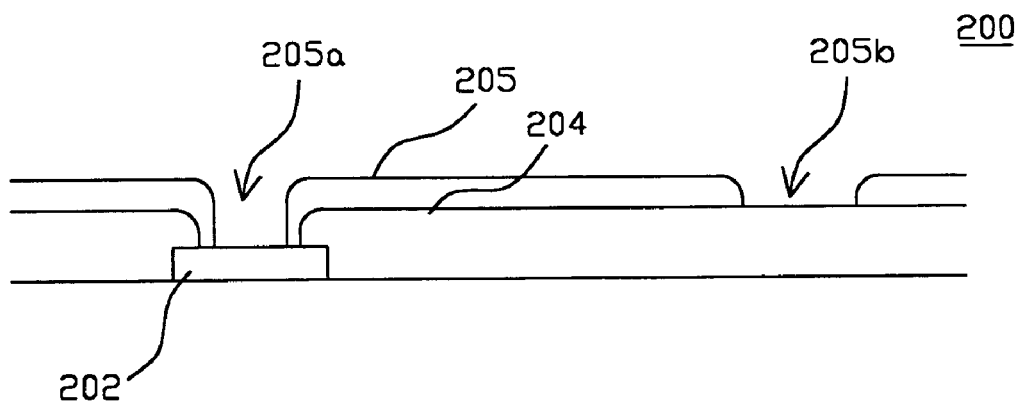
Figure 2C:
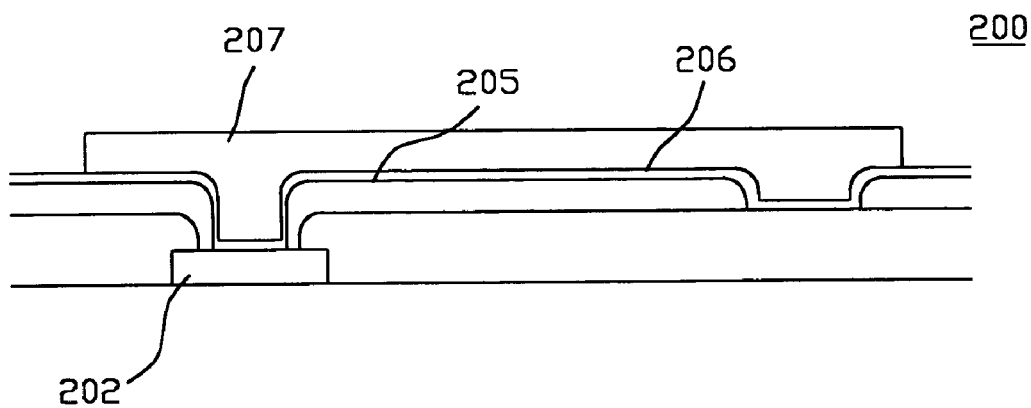

Next, referring to FIG. 2B and FIG. 2C, a first dielectric layer 205 is formed over the passivation layer 204 to form a plurality of first openings 205a (only one is shown) and second openings 205b wherein the first openings 205a expose the bonding pads 202 and the second openings 205b expose portions of the passivation layer 204. To be noted, the first dielectric layer 205 can be made of the material selected from one of polyimide, Benzocyclobutene (BCB) and polymer materials. Next, a first electrically conductive layer 206 is formed over the first dielectric layer 205 wherein the first electrically conductive layer 206 may comprise an adhesive layer contacting the bonding pads 202. For example, the adhesive layer comprises a titanium layer or a copper layer.

Figure 2D:
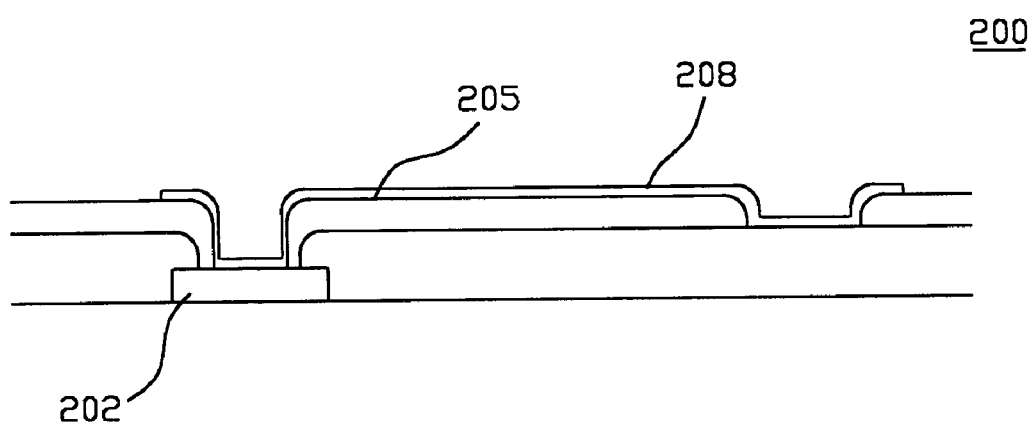

Next, referring to FIG. 2C and FIG. 2D, a first photo-resist layer 207 is formed on the first electrically conductive layer 206 in order to pattern the first electrically conductive layer 206 by removing the portions of the first electrically conductive layer 206 not covered by the first photo-resist layer 207 to form a patterned first electrically conductive layer 208 as shown in FIG. 2D. To be noted, the first electrically conductive layer 206 can be directly formed on the bonding pads and the passivation layers without disposing said first dielectric layer therebetween.

Figure 2E:
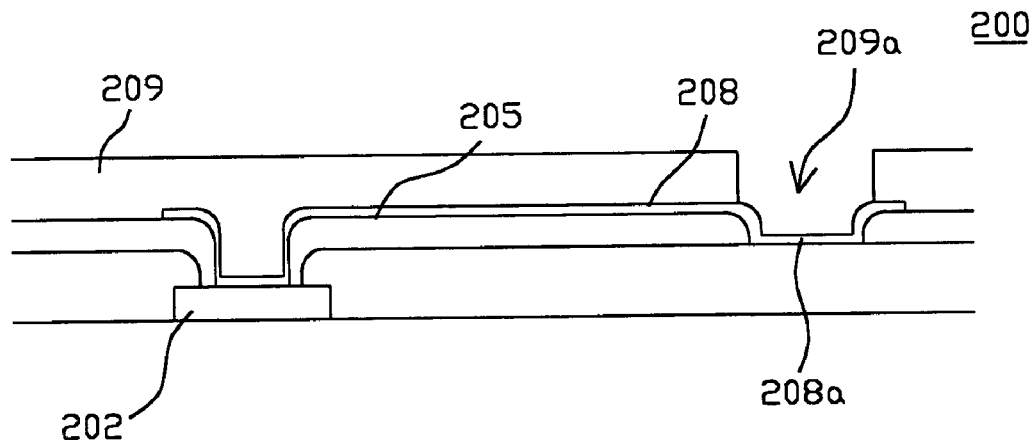

Next, referring to FIG. 2E, a second dielectric layer 209 with third openings 209a is formed over the first dielectric layer 205 and the patterned first electrically conductive layer 208, wherein the third openings expose portions of the patterned first electrically conductive layer 208, directly connecting to the passivation layer 204, to serve as bump pads 208a.

Figure 2F:
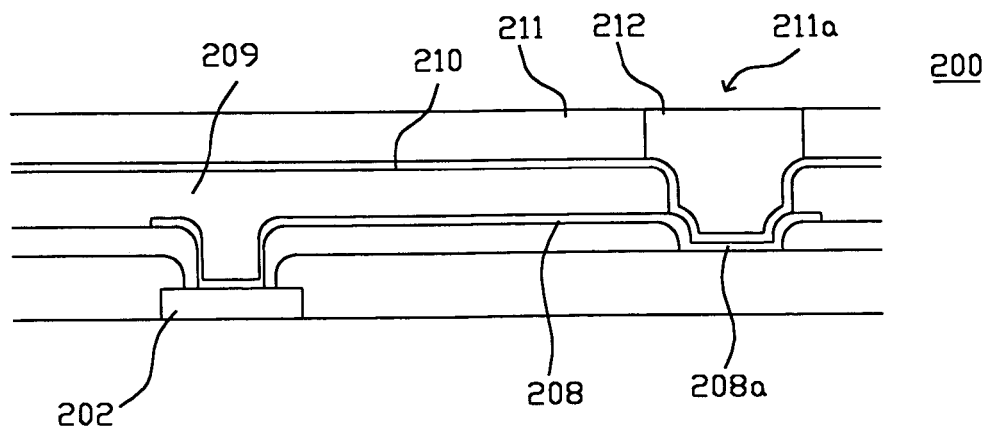

Next, referring to FIG. 2F, a second electrically conductive layer 210 is formed over the second dielectric layer 209 and the bump pads 208a; and, a photo-resist layer 211 is then formed over the portions of the second electrically conductive layer 210, including the portions not covering the bump pads 208a, to form a fourth openings 211a therein.

Afterwards, referring FIG. 2F again, a conductive material, such as a solder material and a gold material, is filled in the openings 211a to form a plurality of solder bumps 212. Therein, the solder material is formed by the method of plating and said solder material may be selected from one of lead-free and solder eutectic. Moreover, a plurality of solder balls can be provided and placed in the third openings 211a.

Figure 2G:
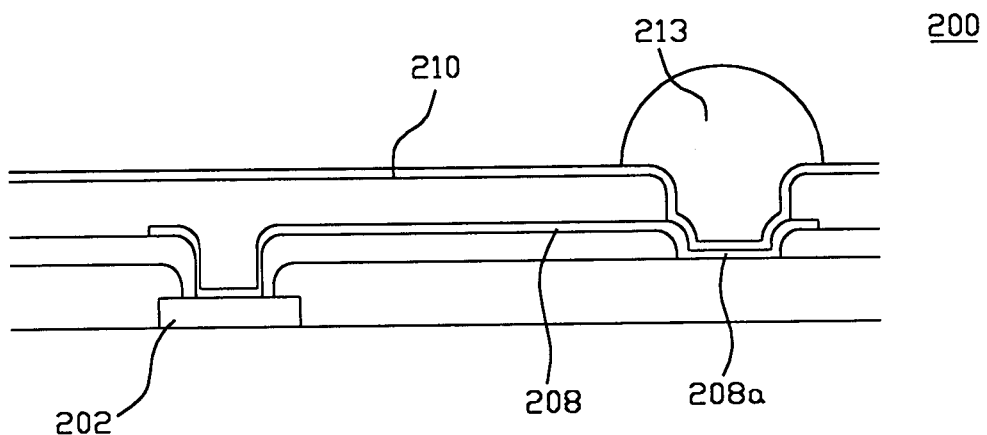

Next, as shown in FIG. 2G, the photo-resist layer 211 is removed and a reflowed process is performed to shape the bumps 213 into a ball-like shape or a solder ball 213

Figure 2H:
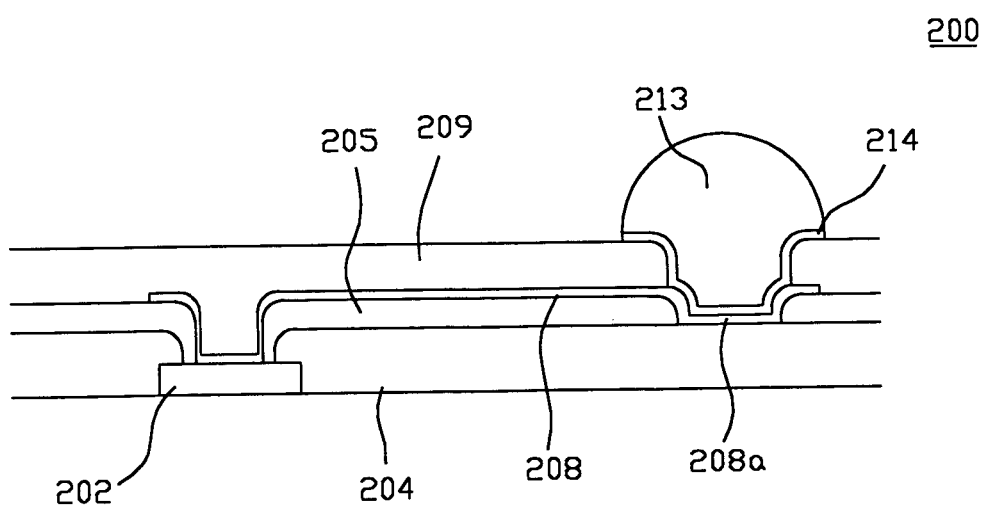

Referring to FIG. 2H, the second electrically conductive layer 210 is then patterned through taking the reflowed bumps 213 as masks to etch away the portions of the second electrically conductive layer 210 not covered by the reflowed bumps 213 to form patterned second electrically conductive layer 214. To be noted, the patterned first electrically conductive layer 208 may comprise a titanium layer or an aluminum layer; and the patterned second electrically conductive layer 214 may comprises two layers made of a nickel-vanadium layer and a copper layer or may comprise three layers made of a titanium layer, a nickel-vanadium layer and a copper layer.

As mentioned above, when the reflow process is performed, the second dielectric layer is covered by the second electrically conductive layer. Hence, the bumps are separated from the second dielectric layer so as to avoid the flux reacting with the second dielectric layer. Accordingly, the reliability of the reflowed bumps will be kept great.

Furthermore, the photo-resist layer for defining the locations and size of the bumps is disposed over the second electrically conductive layer so as to avoid the etchant reacting with the second dielectric layer located below the second electrically conductive layer when removing said photo-resist layer. In such a manner, the integrity of the second dielectric layer and the capability of protecting wafer kept will be kept great.

In addition, the photo-resist layer for defining the locations and size of the bumps is removed before the bumps are reflowed. Accordingly, the bumps will not have bubbles therein due to the reaction of the photo-resist layer with the solder material.

Although the invention has been described in considerable detail with reference to certain preferred embodiments, it will be appreciated and understood that various changes and modifications may be made without departing from the spirit and scope of the invention as defined in the appended claims.

What is claimed is:

1. A method of forming a plurality of bumps on a wafer having an active surface, wherein the wafer further includes a plurality of bonding pads formed on the active surface and a passivation layer formed on the active surface that exposes the bonding pads through passivation openings, the method comprising the steps of:

forming a first dielectric layer over the active surface of the wafer wherein the first dielectric layer has a plurality of first openings and second openings exposing the bonding pads and portions of the passivation layer respectively;

forming a first electrically conductive layer over the first dielectric layer, the bonding pads and the portions of the passivation layer exposing through the second openings;

removing portions of the first electrically conductive layer to form a patterned first electrically conductive layer covering the first dielectric layer, the bonding pads and the portions of the passivation layer exposing through the second openings;

forming a second dielectric layer with third openings over the first dielectric layer and the patterned first electrically conductive layer, wherein the third openings expose portions of the patterned first electrically conductive layer disposed in the second openings and the portions of the patterned first electrically conductive layer exposed out of the second dielectric layer serve as bump pads and are electrically connected to the bonding pads through the patterned first electrically conductive layer;

forming a second electrically conductive layer over the second dielectric layer and the bump pads;

forming a photo-resist layer with fourth openings on the second electrically conductive layer, and the fourth openings expose the second electrically conductive layer located over the bump pads;

disposing a conductive material in the fourth openings located over the bump pads to form a plurality of bumps;

removing the photo-resist layer;

reflowing the bumps to form a plurality of reflowed balls securely attached to the bump pads; and after reflowing the bumps, removing the second electrically conductive layer to leave portions of the second electrically conductive layer covered by the reflowed balls to form a patterned second electrically conductive layer.

2. The method of claim 1, wherein the first dielectric layer is made of polyimide.

3. The method of claim 1, wherein the first dielectric layer is made of Benzocyclobutene.

4. The method of claim 1, wherein the first electrically conductive layer is made of a material selected from one of titanium, titanium-tungsten, aluminum and chromium.

5. The method of claim 1, wherein the second electrically conductive layer is made of a material selected from one of nickel-vanadium, nickel, chromium-copper and nickel-titanium.

6. The method of claim 1, wherein the conductive material is filled in the fourth openings by the way of plating.

7. The method of claim 1, wherein the conductive material is filled in the fourth openings by the way of screen-printing.

8. The method of claim 1, wherein the second electrically conductive layer comprises a nickel layer, a copper layer, a titanium layer and a nickel layer in sequence.

9. The method of claim 1, wherein the second electrically conductive layer comprises a nickel-vanadium alloy layer and a copper layer.

10. A method of forming a plurality of bumps on a wafer having an active surface, wherein the wafer further comprises a plurality of bonding pads formed on the active surface and a passivation layer formed on the active surface that exposes the bonding pads through passivation openings, the method comprising the steps of:

forming a first electrically conductive layer over the bonding pads and the passivation layer;

removing portions of the first electrically conductive layer to form a patterned first electrically conductive layer covering the bonding pads and the passivation layer;

forming a dielectric layer with a plurality of opening over the passivation layer and the patterned first electrically conductive layer wherein the portions of the patterned first electrically conductive layer exposed out of the dielectric layer through the openings serve as bump pads and are electrically connected to the bonding pads;

forming a second electrically conductive layer over the dielectric layer and the bump pads;

forming a photo-resist layer with other openings on the second electrically conductive layer, and the other openings expose the second electrically conductive layer located over the bump pads;

forming a plurality of bumps in the other openings over exposed portions of the second electrically conductive layer located over the bump pads;

removing the photo-resist layer;

reflowing the bumps to form a plurality of reflowed balls securely attached to the bump pads; and after reflowing the bumps, removing the second electrically conductive layer to leave portions of the second electrically conductive layer covered by the reflowed balls to form a patterned second electrically conductive layer.

11. The method of claim 10, wherein the bumps are formed by the method of solder ball mounting.

12. The method of claim 10, wherein the bumps are formed by filling a solder material in the openings.

13. The method of claim 10, wherein the second dielectric layer is made of polyimide.

14. The method of claim 10, wherein the dielectric layer is made of Benzocyclobutene.

15. The method of claim 10, wherein the first electrically conductive layer is made of a material selected from one of titanium, titanium-tungsten, aluminum and chromium.

16. The method of claim 10, wherein the second electrically conductive layer is made of a material selected from one of nickel-vanadium, nickel, chromium-copper and nickel-titanium.

17. The method of claim 12, wherein the solder material is filled in the openings by way of plating.

18. The method of claim 12, wherein the solder materials is filled in the openings by way of screen-printing.

19. The method of claim 10, wherein the second electrically conductive layer comprises a nickel layer, a copper layer, a titanium layer and a nickel layer in sequence.

20. The method of claim 10, wherein the second electrically conductive layer comprises a nickel-vanadium alloy layer and a copper layer.

\* \* \* \* \*